United States Patent
Khlat (10) Patent No.: US 11,699,950 B2
(45) Date of Patent: Jul. 11, 2023

(54) FAST-SWITCHING POWER MANAGEMENT CIRCUIT OPERABLE TO PROLONG BATTERY LIFE

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/408,899

(22) Filed: Aug. 23, 2021

(65) Prior Publication Data

US 2022/0200447 A1 Jun. 23, 2022

Related U.S. Application Data

(60) Provisional application No. 63/126,854, filed on Dec. 17, 2020.

(51) Int. Cl.
*H02M 3/07* (2006.01)
*H03F 3/21* (2006.01)
(Continued)

(52) U.S. Cl.
CPC .............. *H02M 3/07* (2013.01); *H02J 7/0063* (2013.01); *H03F 1/0238* (2013.01); *H03F 3/211* (2013.01);
(Continued)

(58) Field of Classification Search
CPC ...... H02M 3/07; H02J 7/0063; H02J 2207/20; H03F 1/0238; H03F 3/211;
(Continued)

(56) References Cited

U.S. PATENT DOCUMENTS 7,859,338 B2  12/2010  Bajdechi et al.
8,159,309 B1   4/2012  Khlat et al.
(Continued)

FOREIGN PATENT DOCUMENTS

| DE | 102019218816 A1 | 6/2020 |
|---|---|---|
| WO | 2018187245 A1 | 10/2018 |
| WO | 2021016350 A1 | 1/2021 |

OTHER PUBLICATIONS

Notice of Allowance for U.S. Appl. No. 17/237,244, dated Jan. 27, 2022, 8 pages.
(Continued)

*Primary Examiner* — John W Poos
*Assistant Examiner* — Tyler J Pereny
(74) *Attorney, Agent, or Firm* — Withrow & Terranova, P.L.L.C.

(57) ABSTRACT

A fast-switching power management circuit operable to prolong battery life is provided. The power management circuit includes a voltage circuit that can generate an output voltage for amplifying an analog signal in a number of time intervals and a pair of hybrid circuits each causing the output voltage to change in any of the time intervals. A control circuit is configured to activate any one of the hybrid circuits during a preceding one of the time intervals to cause the output voltage to change in an immediately succeeding one of the time intervals. By starting the output voltage change earlier in the preceding time interval, it is possible to complete the output voltage change within a switching window in the succeeding time interval while concurrently reducing rush current associated with the output voltage change, thus helping to prolong battery life in a device employing the power management circuit.

19 Claims, 5 Drawing Sheets

(51) Int. Cl.
  *H02J 7/00* (2006.01)
  *H03F 1/02* (2006.01)
  *H04L 27/26* (2006.01)
(52) U.S. Cl.
  CPC .... *H03F 2200/451* (2013.01); *H04L 27/2601* (2013.01)
(58) Field of Classification Search
  CPC .. H03F 2200/451; H03F 1/0216; H03F 3/189; H03F 3/24; H04L 27/2601
  See application file for complete search history.

(56) References Cited

U.S. PATENT DOCUMENTS

| | | | |
|---|---|---|---|
| 8,718,188 | B2 | 5/2014 | Balteanu et al. |
| 8,912,769 | B2 | 12/2014 | Lin et al. |
| 9,020,453 | B2 | 4/2015 | Briffa et al. |
| 9,069,365 | B2 | 6/2015 | Brown et al. |
| 9,148,090 | B2 | 9/2015 | Tsuji |
| 9,172,331 | B2 | 10/2015 | Nagasaku et al. |
| 9,231,527 | B2 | 1/2016 | Hur et al. |
| 9,350,299 | B2 | 5/2016 | Tsuji |
| 9,356,760 | B2 | 5/2016 | Larsson et al. |
| 9,391,567 | B2 | 7/2016 | Kaczman |
| 9,407,476 | B2 | 8/2016 | Lim et al. |
| 9,496,828 | B2 | 11/2016 | Ye |
| 9,560,595 | B2 | 1/2017 | Dakshinamurthy et al. |
| 9,590,563 | B2 | 3/2017 | Wimpenny |
| 9,614,477 | B1 | 4/2017 | Rozenblit et al. |
| 9,634,560 | B2 | 4/2017 | Ek |
| 10,097,145 | B1 | 10/2018 | Khlat et al. |
| 10,103,926 | B1 | 10/2018 | Khlat |
| 10,142,074 | B2 | 11/2018 | Wang et al. |
| 10,243,524 | B2 | 3/2019 | Orr |
| 10,476,437 | B2 | 11/2019 | Nag et al. |
| 10,778,094 | B2 | 9/2020 | de Cremoux |
| 10,862,428 | B2 | 12/2020 | Henzler et al. |
| 10,998,859 | B2 | 5/2021 | Khlat |
| 11,018,627 | B2 | 5/2021 | Khlat |
| 11,018,638 | B2 | 5/2021 | Khlat et al. |
| 11,088,660 | B2 | 8/2021 | Lin et al. |
| 11,223,325 | B2 | 1/2022 | Drogi et al. |
| 11,569,783 | B2 | 1/2023 | Nomiyama et al. |
| 2003/0099230 | A1 | 5/2003 | Wenk |
| 2004/0179382 | A1 | 9/2004 | Thaker et al. |
| 2013/0141063 | A1 | 6/2013 | Kay et al. |
| 2013/0141068 | A1 | 6/2013 | Kay et al. |
| 2014/0055197 | A1 | 2/2014 | Khlat et al. |
| 2014/0097895 | A1* | 4/2014 | Khlat ............... H03F 3/245 330/251 |
| 2014/0232458 | A1 | 8/2014 | Arno et al. |
| 2014/0312710 | A1 | 10/2014 | Li |
| 2014/0315504 | A1 | 10/2014 | Sakai et al. |
| 2014/0361837 | A1 | 12/2014 | Strange et al. |
| 2016/0094192 | A1 | 3/2016 | Khesbak et al. |
| 2016/0294587 | A1 | 10/2016 | Jiang et al. |
| 2017/0331433 | A1* | 11/2017 | Khlat ..................... H03F 3/19 |
| 2018/0234011 | A1 | 8/2018 | Muramatsu et al. |
| 2018/0257496 | A1 | 9/2018 | Andoh et al. |
| 2018/0278213 | A1 | 9/2018 | Henzler et al. |
| 2018/0351454 | A1 | 12/2018 | Khesbak et al. |
| 2019/0068234 | A1 | 2/2019 | Khlat et al. |
| 2019/0109566 | A1 | 4/2019 | Folkmann et al. |
| 2019/0181813 | A1 | 6/2019 | Maxim et al. |
| 2019/0222175 | A1 | 7/2019 | Khlat et al. |
| 2019/0288645 | A1 | 9/2019 | Nag et al. |
| 2019/0334750 | A1 | 10/2019 | Nomiyama et al. |
| 2019/0356285 | A1 | 11/2019 | Khlat et al. |
| 2020/0076297 | A1 | 3/2020 | Nag et al. |
| 2020/0127612 | A1 | 4/2020 | Khlat et al. |
| 2020/0136575 | A1 | 4/2020 | Khlat et al. |
| 2020/0204422 | A1 | 6/2020 | Khlat |
| 2020/0212796 | A1 | 7/2020 | Murphy et al. |
| 2020/0266766 | A1 | 8/2020 | Khlat et al. |
| 2020/0295708 | A1 | 9/2020 | Khlat |
| 2020/0321917 | A1 | 10/2020 | Nomiyama et al. |
| 2020/0336105 | A1* | 10/2020 | Khlat ................. H03F 1/0211 |
| 2020/0336111 | A1* | 10/2020 | Khlat ................. H03F 1/0211 |
| 2020/0389132 | A1 | 12/2020 | Khlat et al. |
| 2021/0036604 | A1 | 2/2021 | Khlat et al. |
| 2021/0126599 | A1 | 4/2021 | Khlat et al. |
| 2021/0175798 | A1 | 6/2021 | Liang |
| 2021/0184708 | A1 | 6/2021 | Khlat |
| 2021/0194517 | A1 | 6/2021 | Mirea et al. |
| 2021/0226585 | A1 | 7/2021 | Khlat |
| 2021/0257971 | A1 | 8/2021 | Kim et al. |
| 2021/0265953 | A1 | 8/2021 | Khlat |
| 2021/0288615 | A1 | 9/2021 | Khlat |
| 2021/0389789 | A1 | 12/2021 | Khlat et al. |
| 2021/0391833 | A1 | 12/2021 | Khlat et al. |
| 2022/0021302 | A1 | 1/2022 | Khlat et al. |
| 2022/0029614 | A1 | 1/2022 | Khlat |
| 2022/0037982 | A1 | 2/2022 | Khlat et al. |
| 2022/0052655 | A1 | 2/2022 | Khalt |
| 2022/0057820 | A1 | 2/2022 | Khlat et al. |
| 2022/0066487 | A1 | 3/2022 | Khlat |
| 2022/0069788 | A1 | 3/2022 | King et al. |
| 2022/0123744 | A1 | 4/2022 | Khlat |
| 2022/0224364 | A1 | 7/2022 | Kim et al. |
| 2022/0271714 | A1 | 8/2022 | Khlat |

OTHER PUBLICATIONS

Non-Final Office Action for U.S. Appl. No. 17/325,482, dated Mar. 15, 2022, 10 pages.
Non-Final Office Action for U.S. Appl. No. 17/315,652, dated Feb. 14, 2022, 12 pages.
International Search Report and Written Opinion for International Patent Application No. PCT/US2021/061721, dated Mar. 14, 2022, 13 pages.
Mellon, L., "Data Transmission—Parallel vs Serial," Jul. 10, 2017, https://www.quantil.com/content-delivery-insights/content-acceleration/data-transmission/, 4 pages.
Non-Final Office Action for U.S. Appl. No. 17/237,244, dated Sep. 20, 2021, 14 pages.
Non-Final Office Action for U.S. Appl. No. 17/325,482, dated Sep. 30, 2021, 10 pages.
Non-Final Office Action for U.S. Appl. No. 17/315,652, dated Sep. 2, 2021, 7 pages.
Non-Final Office Action for U.S. Appl. No. 17/217,654, dated Jul. 1, 2022, 9 pages.
Non-Final Office Action for U.S. Appl. No. 17/218,904, dated May 25, 2022, 14 pages.
Notice of Allowance for U.S. Appl. No. 17/315,652, dated Jun. 20, 2022, 8 pages.
International Search Report and Written Opinion for International Patent Application No. PCT/US2021/044596, dated Apr. 21, 2022, 13 pages.
Written Opinion for International Patent Application No. PCT/US2021/044596, dated Jun. 10, 2022, 6 pages.
International Preliminary Report on Patentability for International Patent Application No. PCT/US2021/044596, dated Sep. 1, 2022, 19 pages.
Notice of Allowance for U.S. Appl. No. 17/182,539, dated Sep. 14, 2022, 7 pages.
Notice of Allowance for U.S. Appl. No. 17/217,654, dated Oct. 12, 2022, 8 pages.
Notice of Allowance for U.S. Appl. No. 17/218,904, dated Aug. 26, 2022, 9 pages.
Final Office Action for U.S. Appl. No. 17/325,482, dated Aug. 16, 2022, 12 pages.
Advisory Action for U.S. Appl. No. 17/325,482, dated Oct. 14, 2022, 3 pages.
Non-Final Office Action for U.S. Appl. No. 17/408,899, dated Aug. 29, 2022, 13 pages.
Written Opinion for International Patent Application No. PCT/US2021/061721, dated Sep. 9, 2022, 7 pages.

(56) References Cited

OTHER PUBLICATIONS

Notice of Allowance for U.S. Appl. No. 17/325,482, dated Nov. 30, 2022, 8 pages.
Written Opinion for International Patent Application No. PCT/US2021/061721, dated Mar. 1, 2023, 7 pages.
Paek, J.S et al., "15.2 A 90ns/V Fast-Transition Symbol-Power-Tracking Buck Converter for 5G mm-Wave Phased-Array Transceiver," 2019 IEEE International Solid-State Circuits Conference, Feb. 2019, San Francisco, CA, USA, IEEE, 3 pages.
Notice of Allowance for U.S. Appl. No. 17/217,594, dated Apr. 3, 2023, 7 pages.
Non-Final Office Action for U.S. Appl. No. 17/942,472, dated Feb. 16, 2023, 13 pages.
Extended European Search Report for European Patent Application No. 22195683.2, dated Feb. 10, 2023, 12 pages.
Extended European Search Report for European Patent Application No. 22200302.2, dated Mar. 1, 2023, 14 pages.
Extended European Search Report for European Patent Application No. 22200322.0, dated Mar. 1, 2023, 13 pages.
Extended European Search Report for European Patent Application No. 22200300.6, dated Feb. 24, 2023, 10 pages.
Extended European Search Report for European Patent Application No. 22200111.7, dated Feb. 20, 2023, 9 pages.
International Preliminary Report on Patentability for International Patent Application No. PCT/US2021/061721, dated Apr. 4, 2023, 21 pages.

\* cited by examiner

FAST-SWITCHING POWER MANAGEMENT CIRCUIT OPERABLE TO PROLONG BATTERY LIFE

RELATED APPLICATIONS

This application claims the benefit of provisional patent application Ser. No. 63/126,854, filed Dec. 17, 2020, the disclosure of which is hereby incorporated herein by reference in its entirety.

FIELD OF THE DISCLOSURE

The technology of the disclosure relates generally to a power management circuit.

BACKGROUND

Fifth-generation (5G) new radio (NR) (5G-NR) has been widely regarded as the next generation of wide-area wireless communication technology beyond the current third-generation (3G) and fourth-generation (4G) technologies. In this regard, a wireless communication device capable of supporting the 5G-NR wireless communication technology is expected to achieve higher data rates, improved coverage range, enhanced signaling efficiency, and reduced latency across a wide range of radio frequency (RF) bands, which include a low-band (below 1 GHz), a mid-band (1 GHz to 6 GHz), and a high-band (above 24 GHz). Moreover, the wireless communication device may still support the legacy 3G and 4G technologies for backward compatibility.

Figure 1:
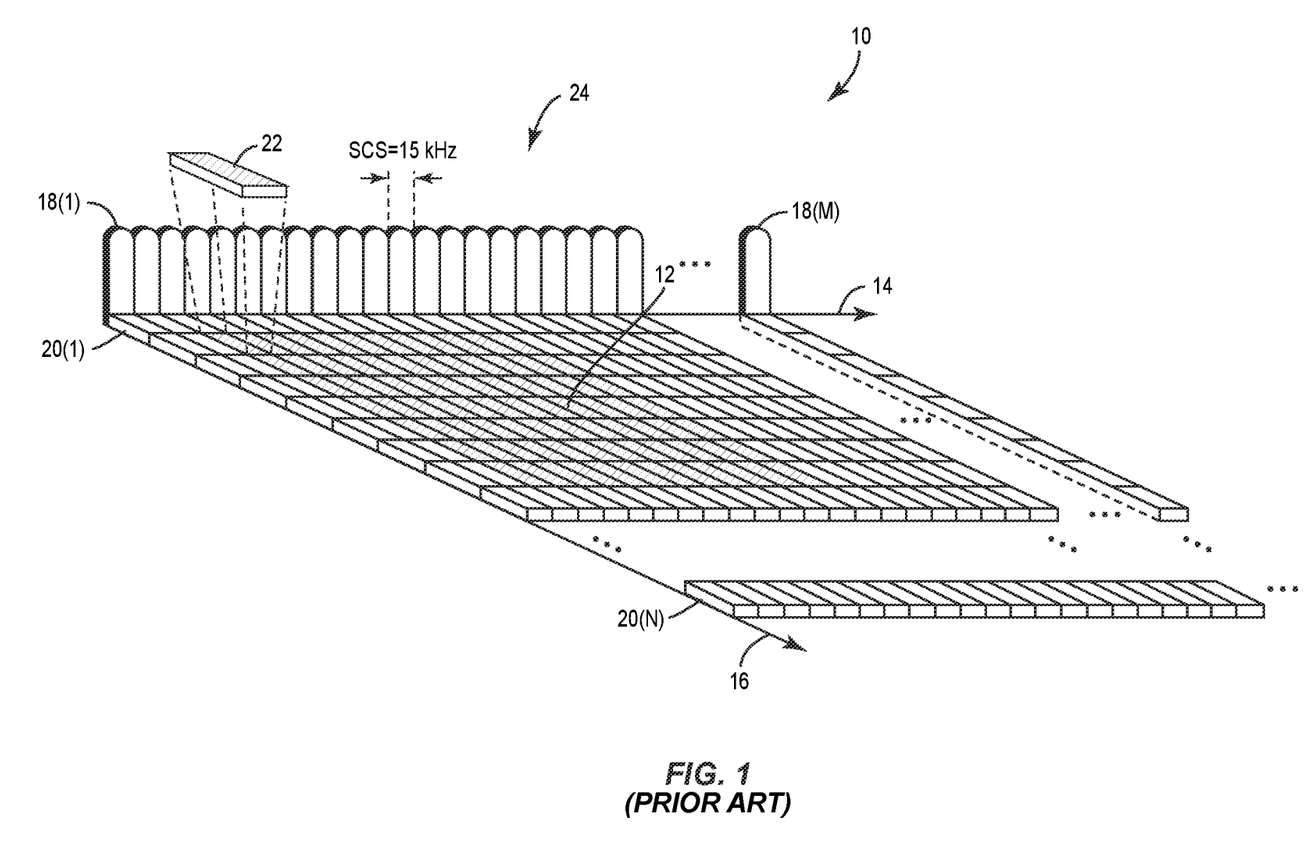
FIG. 1 is a schematic diagram of an exemplary orthogonal frequency division multiplexing (OFDM) time-frequency grid illustrating at least one reserve block (RB) for physical resource allocation.

Downlink and uplink transmissions in a 5G-NR system are widely based on orthogonal frequency division multiplexing (OFDM). In this regard, FIG. 1 is a schematic diagram of an exemplary OFDM time-frequency grid 10 illustrating at least one reserve block (RB 12) for physical resource allocation in the 5G-NR system. The OFDM time-frequency grid 10 includes a frequency axis 14 representing a frequency domain and a time axis 16 representing a time domain. Along the frequency axis 14, there are a number of subcarriers 18(1)-18(M). The subcarriers 18(1)-18(M) are orthogonally separated from each other by a subcarrier spacing (SCS) of 15 KHz, for example. Along the time axis 16, there are a number of OFDM symbols 20(1)-20(N). Each of the OFDM symbols 20(1)-20(N) is separated by a cyclic prefix (CP) (not shown) configured to act as a guard band to help overcome inter-symbol interference (ISI) between the OFDM symbols 20(1)-20(N). In the OFDM time-frequency grid 10, each intersection of the subcarriers 18(1)-18M) and the OFDM symbols 20(1)-20(N) defines a resource element (RE) 22.

In a 5G-NR communication system, an RF signal 24 can be modulated into multiple subcarriers among the subcarriers 18(1)-18(N) in the frequency domain (along the frequency axis 14) and multiple OFDM symbols among the OFDM symbols 20(1)-20(N) in the time domain (along the time axis 16). The table (Table 1) below summarizes OFDM configurations supported by the 5G-NR communication system.

TABLE 1

| SCS (KHz) | Slot Length (μs) | # of Slots per Subframe | CP (μs) | OFDM Symbol Duration (μs) | Modulation Bandwidth (MHz) |
| --- | --- | --- | --- | --- | --- |
| 15 | 1000 | 1 | 4.69 | 71.43 | 50 |
| 30 | 500 | 2 | 2.34 | 35.71 | 100 |
| 60 | 250 | 4 | 1.17 | 17.86 | 200 |
| 120 | 125 | 8 | 0.59 | 8.93 | 400 |

In the 5G-NR communication system, the RF signal 24 is typically modulated with a high modulation bandwidth in excess of 200 MHz. In this regard, according to Table 1, the SCS will be 120 KHz and a transition settling time between two consecutive OFDM symbols among the OFDM symbols 20(1)-20(N) (e.g., amplitude change of the RF signal) needs to be less than or equal to the CP duration of 0.59 μs.

In addition, the wireless communication device may also need to support such internet-of-things (IoT) applications as keyless car entry, remote garage door opening, contactless payment, mobile boarding pass, and so on.

Needless to say, the wireless communication device must also always make 911/E911 service accessible under emergency situations. As such, it is critical that the wireless communication device remains operable whenever needed.

Notably, the wireless communication device relies on a battery cell (e.g., Li-Ion battery) to power its operations and services. Despite recent advancement in battery technologies, the wireless communication device can run into a low battery situation from time to time. In this regard, it is desirable to prolong battery life concurrent to enabling fast voltage changes between the OFDM symbols 20(1)-20(N).

SUMMARY

Embodiments of the disclosure relate to a fast-switching power management circuit operable to prolong battery life. The power management circuit includes a voltage circuit that can generate an output voltage for amplifying an analog signal in a number of time intervals. The power management circuit also includes a pair of hybrid circuits each causing the output voltage to change in any of the time intervals. A control circuit is configured to activate the hybrid circuits alternately to change the output voltage in the time intervals. More specifically, the control circuit activates any one of the hybrid circuits during a preceding one of the time intervals to cause the output voltage to change in an immediately succeeding one of the time intervals. By starting the output voltage change earlier in the preceding time interval, it is possible to complete the output voltage change within a switching window in the succeeding time interval while concurrently reducing rush current associated with the output voltage change, thus helping to prolong battery life in a device employing the power management circuit.

In one aspect, a fast-switching power management circuit is provided. The fast-switching power management circuit includes a voltage circuit. The voltage circuit is configured to generate a reference voltage at a reference node and an output voltage at a voltage output based on a battery voltage. The fast-switching power management circuit also includes a first hybrid circuit and a second hybrid circuit each coupled between the reference node and the voltage output and configured to adjust the output voltage based on the reference voltage. The fast-switching power management circuit also includes a control circuit. The control circuit is configured to receive a target voltage indicating that the output voltage will change from a present voltage level in a present time interval among a number of time intervals to a future voltage level in a future time interval immediately succeeding the present time interval among the time intervals. The control circuit is also configured to activate a first one of the first hybrid circuit and the second hybrid circuit prior to a start of the future time interval to thereby cause the output voltage to change from the present voltage level to the future voltage level within a switching window from the start of the future time interval.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a fast-switching power management circuit operable to prolong battery life. The power management circuit includes a voltage circuit that can generate an output voltage for amplifying an analog signal in a number of time intervals. The power management circuit also includes a pair of hybrid circuits each causing the output voltage to change in any of the time intervals. A control circuit is configured to activate the hybrid circuits alternately to change the output voltage in the time intervals. More specifically, the control circuit activates any one of the hybrid circuits during a preceding one of the time intervals to cause the output voltage to change in an immediately succeeding one of the time intervals. By starting the output voltage change earlier in the preceding time interval, it is possible to complete the output voltage change within a switching window in the succeeding time interval while concurrently reducing rush current associated with the output voltage change, thus helping to prolong battery life in a device employing the power management circuit.

Figure 2:
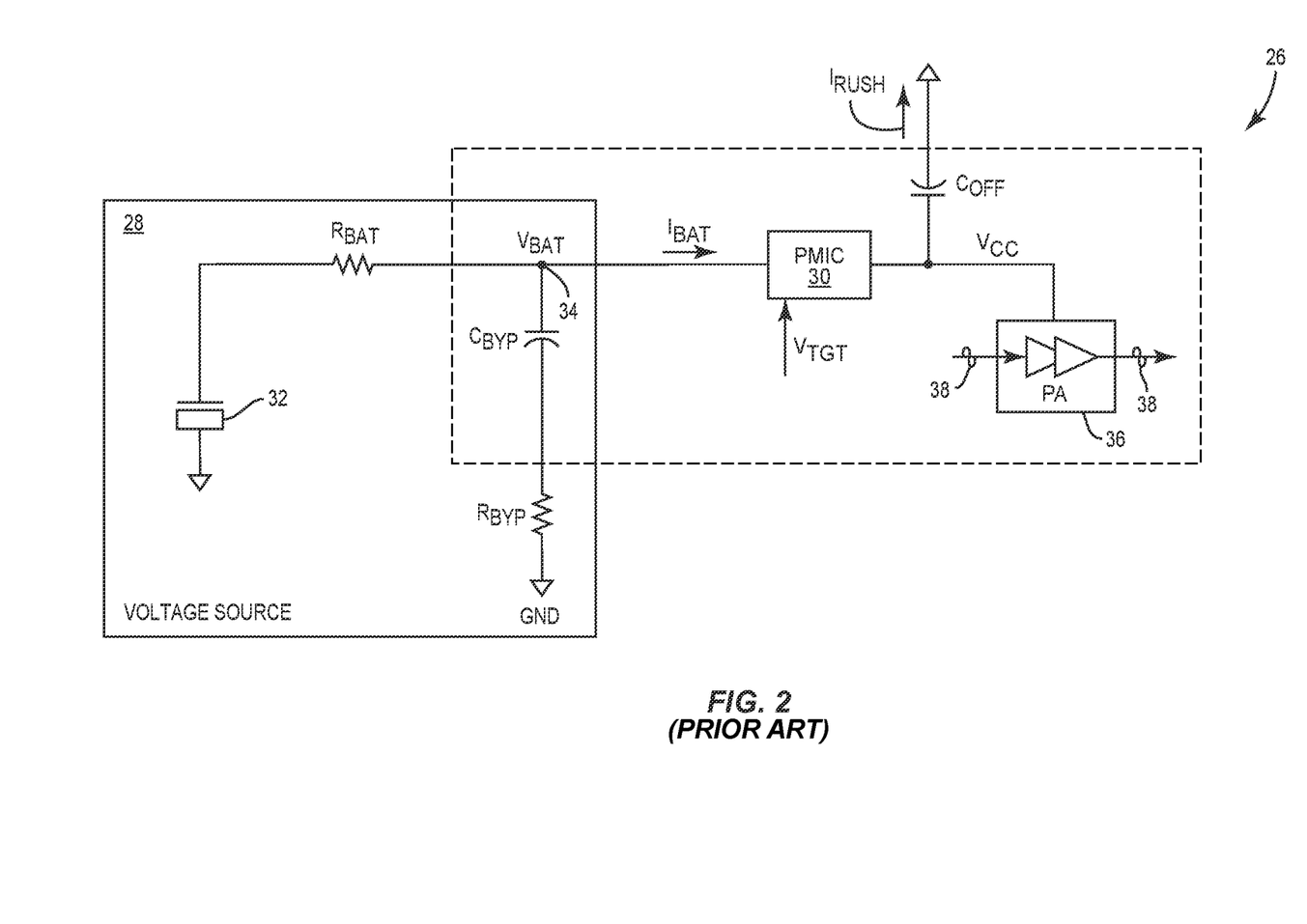
FIG. 2 is a schematic diagram of an exemplary conventional power management circuit that can draw a large rush current during voltage switching.
Figure 3:
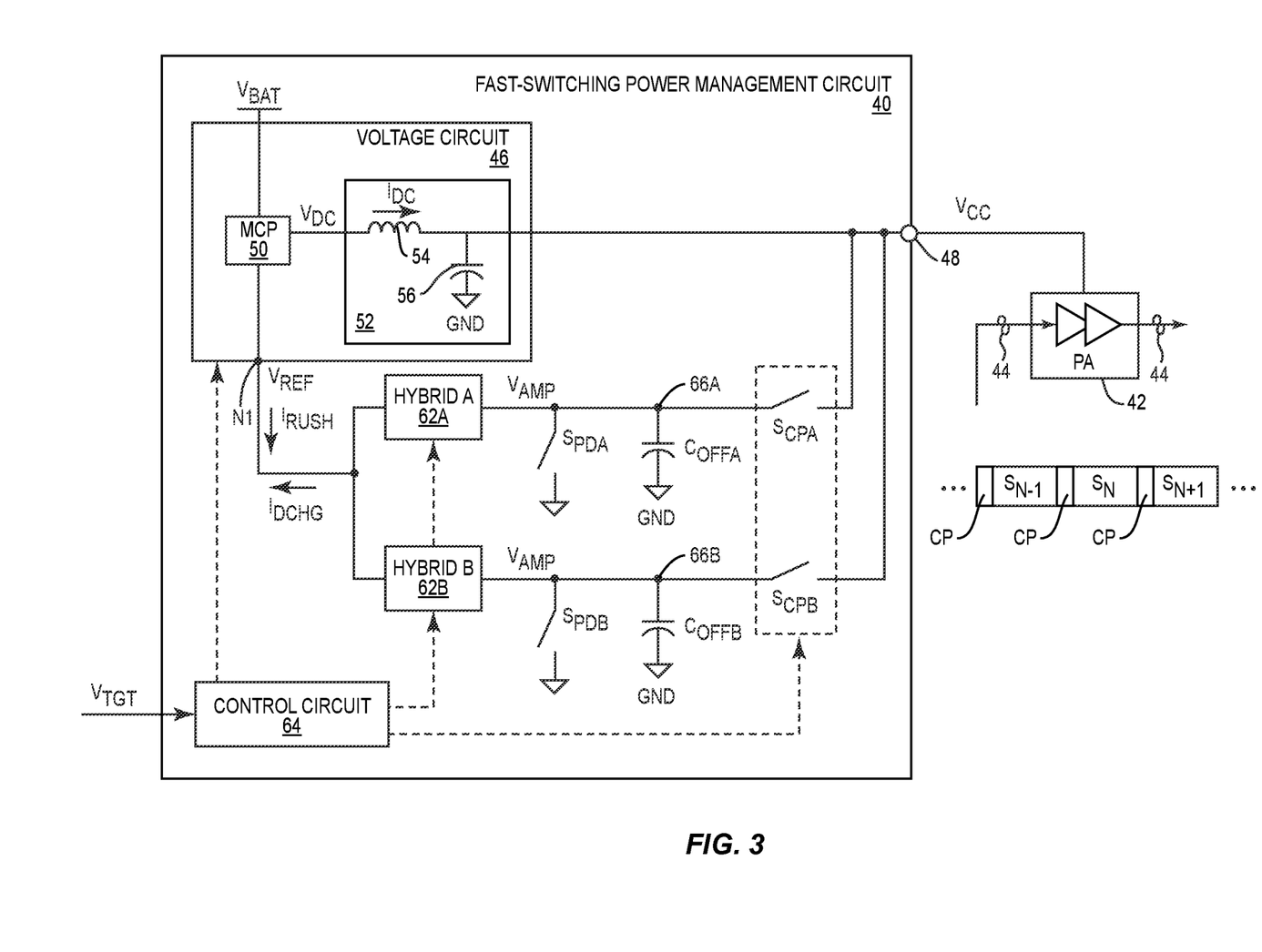
FIG. 3 is a schematic diagram of an exemplary fast-switching power management circuit configured according to embodiments of the present disclosure to enable fast voltage switching and prolong battery life.

Before discussing the power management circuit according to the present disclosure, starting at FIG. 3, an overview of a conventional power management circuit that can draw a larger rush current during voltage switching is first provided with reference to FIG. 2.

FIG. 2 is a schematic diagram of an exemplary conventional power management circuit 26 that can draw a large rush current $I_{RUSH}$ during voltage switching. The conventional power management circuit 26 includes a voltage source 28 and a power management integrated circuit (PMIC) 30. The voltage source 28 includes a battery 32 (e.g., a Li-Ion battery) coupled to a coupling node 34 via a resistor $R_{BAT}$ to supply a battery voltage $V_{BAT}$ at the coupling node 34. The coupling node 34 may be coupled to a ground (GND) via a capacitor $C_{BYP}$ and another resistor $R_{BYP}$. The PMIC 30 is coupled to the coupling node 34 to receive the battery voltage $V_{BAT}$ and draw a battery current $I_{BAT}$. Accordingly, the PMIC 30 is configured to generate an output voltage $V_{CC}$ based on the battery voltage $V_{BAT}$ and provide the output voltage $V_{CC}$ to a power amplifier circuit 36 for amplifying an analog signal 38.

The analog signal 38 may be modulated across a wide modulation bandwidth, which can cause a large variation of RF current at the power amplifier circuit 36. As such, it is necessary to present a low impedance to the power amplifier circuit 36 to help reduce ripple in the output voltage $V_{CC}$ caused by the RF current. In this regard, the conventional power management circuit 26 typically includes an offset capacitor $C_{OFF}$ to help reduce the impedance seen by the power amplifier circuit 36.

In addition to impedance matching, the offset capacitor $C_{OFF}$ is also used to maintain the output voltage $V_{CC}$ at a desired voltage level. In this regard, the offset capacitor $C_{OFF}$ needs to be charged whenever the output voltage $V_{CC}$ increases and discharged whenever the output voltage $V_{CC}$ decreases. As such, as shown in the equation (Eq. 1) below, a change rate ($dV_{CC}/dt$) of the output voltage $V_{CC}$ is dependent on how fast the offset capacitor $C_{OFF}$ can be charged or discharged.

$$dV_{CC}/dt = I_{RUSH}/C_{OFF} \quad \text{(Eq. 1)}$$

In the equation (Eq. 1) above, $I_{RUSH}$ represents a rush current associated with charging/discharging of the offset capacitor $C_{OFF}$ and $C_{OFF}$ represents a capacitance of the offset capacitor $C_{OFF}$. Particularly, when the offset capacitor $C_{OFF}$ is charged in response to an increase of the output voltage $V_{CC}$, the offset capacitor $C_{OFF}$ draws the rush current $I_{RUSH}$ from the battery 32. Given that the capacitance $C_{OFF}$ is typically fixed and relatively large (e.g., 2.2 μF), the only way to reduce switching time of the output voltage $V_{CC}$ is to increase the rush current $I_{RUSH}$. For example, when the output voltage $V_{CC}$ changes from 1 V to 5.5 V within 0.59 μs, the rush current $I_{RUSH}$ can be as high as 17 Amps (A), which can significantly reduce operating time of the battery 32.

To avoid amplitude clipping to the analog signal 38 at the power amplifier circuit 36, the PMIC 30 is configured to generate the output voltage $V_{CC}$ in accordance with a target voltage VTGT that corresponds to an average power of the analog signal 38. As such, the output voltage $V_{CC}$ can swing from low to high, or vice versa, from time to time. When the conventional power management circuit 26 is provided in a legacy second generation (2G), third generation (3G), or even fourth generation (4G) wireless communication device, the output voltage $V_{CC}$ may change at a relatively slower rate. As such, the rush current $I_{RUSH}$ may have a lesser impact on the battery 32. However, in a fifth generation (5G) new radio (5G-NR) wireless communication device, the output voltage $V_{CC}$ may need to change very frequently (e.g., between each of the OFDM symbols 20(1)-20(N) in FIG. 1) and rapidly (e.g., within the CP duration of 0.59 μs). As a result, the rush current $I_{RUSH}$ can have a tremendous impact on battery life. As such, it is desirable to reduce the rush current $I_{RUSH}$ concurrent to supporting fast and frequent switching of the output voltage $V_{CC}$.

In this regard, FIG. 3 is a schematic diagram of an exemplary fast-switching power management circuit 40 configured according to embodiments of the present disclosure to support fast voltage switching and prolong battery life. The fast-switching power management circuit 40 is configured to provide an output voltage $V_{CC}$, which can be an average power tracking (APT) voltage, to a power amplifier circuit 42 for amplifying an analog signal 44 for transmission in a number of time intervals $S_{N-1}$, $S_N$, and $S_{N+1}$, and so on. Notably, the time intervals $S_{N-1}$, $S_N$, and $S_{N+1}$ are shown herein for the sake of illustration. It should be appreciated that the analog signal 44 can in fact be transmitted in any number of time intervals.

In a non-limiting example, the time intervals $S_{N-1}$, $S_N$, and $S_{N+1}$ can be any three consecutive OFDM symbols among the OFDM symbols 20(1)-20(N) in FIG. 1. As such, as previously mentioned in FIG. 1, each of the OFDM symbols $S_{N-1}$, $S_N$, and $S_{N+1}$ starts with a respective cyclic prefix (CP). Accordingly, any change in the output voltage $V_{CC}$ in any of the OFDM symbols $S_{N-1}$, $S_N$, and $S_{N+1}$ must be completed withing the respective CP. In this regard, the CP in each of the OFDM symbols $S_{N-1}$, $S_N$, and $S_{N+1}$ is also referred to as a "switching window" hereinafter.

However, it should be appreciated that the time intervals $S_{N-1}$, $S_N$, and $S_{N+1}$ are not limited to the OFDM symbols. For example, the time intervals $S_{N-1}$, $S_N$, and $S_{N+1}$ can also refer to frames (e.g., Wi-Fi frames). In this regard, the switching window can refer to an inter-frame spacing (IFS) between frames.

As discussed in detail below, the fast-switching power management circuit 40 can be configured to start changing the output voltage $V_{CC}$ in any of the time intervals $S_{N-1}$, $S_N$, and $S_{N+1}$ prior to a start of the respective time interval, as opposed to starting at the start of the respective time interval. For example, the fast-switching power management circuit 40 starts changing the output voltage $V_{CC}$ for the time interval $S_N$ during the time interval $S_{N-1}$ and starts changing the output voltage $V_{CC}$ for the time interval $S_{N+1}$ during the time interval $S_N$. By starting to change the output voltage $V_{CC}$ earlier, the fast-switching power management circuit 40 will have more time to complete the voltage change for each of the time intervals $S_{N-1}$, $S_N$, and $S_{N+1}$. In other words, the rate of voltage change $dV_{CC}/dt$ will be slower. Thus, according to the equation (Eq. 1) above, it is possible to reduce demand for the rush current $I_{RUSH}$ to help prolong battery life. Further, by starting to change the output voltage $V_{CC}$ earlier, it is also possible to ensure that the voltage change can be completed within the switching window (e.g., CP) in each of the time intervals $S_{N-1}$, $S_N$, and $S_{N+1}$, thus helping to avoid amplitude distortion to the analog signal 44 at the power amplifier circuit 42.

The fast-switching power management circuit 40 includes a voltage circuit 46 configured to generate the output voltage $V_{CC}$ at a voltage output 48. The voltage output 48 is coupled to the power amplifier circuit 42 to thereby provide the output voltage $V_{CC}$ to the power amplifier circuit 42 for amplifying the analog signal 44. The voltage circuit 46 is also configured to generate a reference voltage $V_{REF}$ at a reference node N1.

The voltage circuit 46 includes a multi-level charge pump 50 (denoted as "MCP") and an inductor-capacitor (LC) filter circuit 52. The multi-level charge pump 50 is coupled to a voltage source (not shown) to receive a battery voltage $V_{BAT}$. The LC filter circuit 52 includes a power inductor 54 and a bypass capacitor 56. The power inductor 54 is coupled between the multi-level charge pump 50 and the voltage output 48, and the bypass capacitor 56 is coupled between the voltage output 48 and a ground (GND).

The multi-level charge pump 50 is configured to generate a low-frequency voltage $V_{DC}$ at multiple voltage levels based on the battery voltage $V_{BAT}$. In a non-limiting example, the multi-level charge pump 50 can operate in a buck mode to generate the low-frequency voltage $V_{DC}$ at or below the battery voltage $V_{BAT}$ ($V_{DC} \leq V_{BAT}$) or in a boost mode to generate the low-frequency voltage $V_{DC}$ at two times the battery voltage $V_{BAT}$ ($V_{DC}=2V_{BAT}$).

The LC filter circuit 52 is configured to function as a low-pass filter. Specifically, the power inductor 54 induces a respective low-frequency current IDC (e.g., a constant current) based on each of the multiple levels of the low-frequency voltage $V_{DC}$ to charge the bypass capacitor 56. Notably, the multi-level charge pump 50 may generate the low-frequency voltage $V_{DC}$ at different levels based on a selected duty cycle. Accordingly, the LC filter circuit 52 is configured to generate the output voltage $V_{CC}$ at the voltage output 48 as an average of the multiple voltage levels of the low-frequency voltage $V_{DC}$. For example, if the multi-level charge pump 50 is configured to generate the low-frequency voltage $V_{DC}$ at 1 V for 70% of the time and at 5 V for 30% of the time, then the LC filter circuit 52 will generate the output voltage $V_{CC}$ at 2.2 V (1 V*70%+5 V*30%).

Figure 4A:
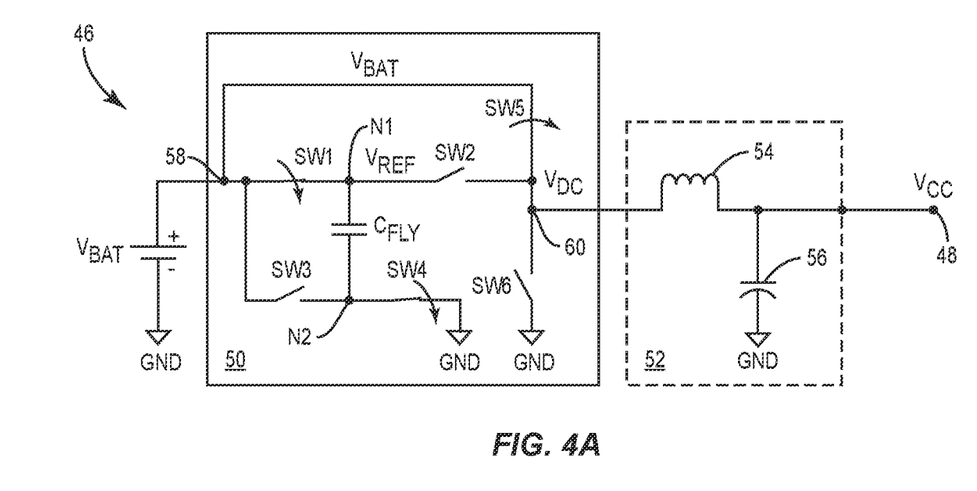
FIGS. 4A and 4B are schematic diagrams providing exemplary illustrations of different operating modes of a voltage circuit in the power management circuit of FIG. 3.
Figure 4B:
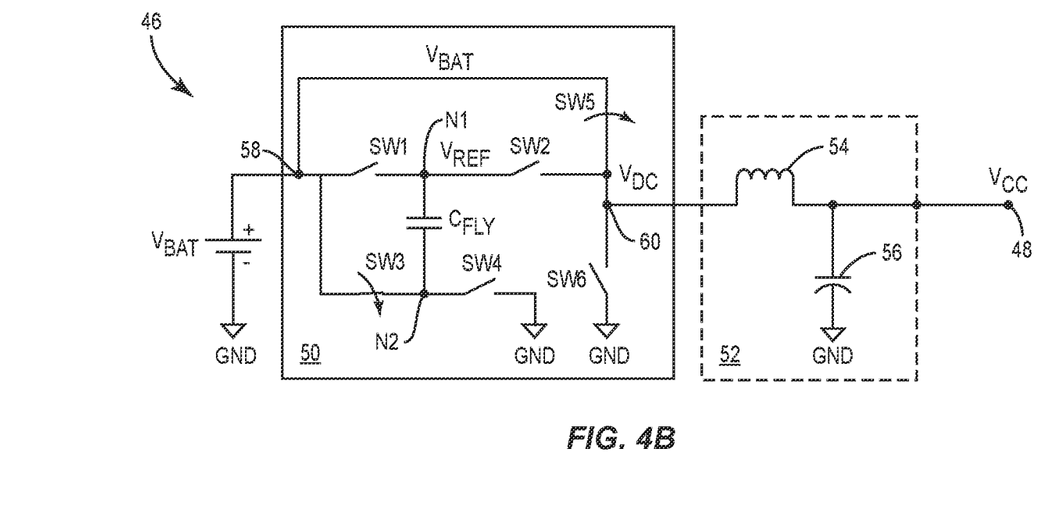

FIGS. 4A and 4B are schematic diagrams providing exemplary illustrations of different operating modes of the voltage circuit 46 in the fast-switching power management circuit 40 of FIG. 3. Specifically, FIG. 4A illustrates an operating mode of the voltage circuit 46 that generates the reference voltage $V_{REF}$ and the output voltage $V_{CC}$ that equals the battery voltage $V_{BAT}$. Common elements between FIGS. 3 and 4A are shown therein with common element numbers and will not be re-described herein.

The multi-level charge pump 50 includes an input node 58, an output node 60, the reference node N1, and an intermediate node N2. Specifically, the input node 58 is coupled to the voltage source (e.g., a battery) to receive the battery voltage $V_{BAT}$, and the output node 60 is coupled to the LC filter circuit 52 to output the low-frequency voltage $V_{DC}$. The multi-level charge pump 50 includes a first switch SW1, a second switch SW2, a third switch SW3, a fourth switch SW4, a fifth switch SW5, and a sixth switch SW6. The first switch SW1 is coupled between the input node 58 and the reference node N1. The second switch SW2 is coupled between the reference node N1 and the output node 60. The third switch SW3 is coupled between the input node 58 and the intermediate node N2. The fourth switch SW4 is coupled between the intermediate node N2 and the GND. The fifth switch SW5 is coupled between the input node 58 and the output node 60. The sixth switch SW6 is coupled between the output node 60 and the GND. The multi-level charge pump 50 also includes a fly capacitor $C_{FLY}$ that is coupled between the reference node N1 and the intermediate node N2.

To cause the voltage circuit 46 to generate the reference voltage $V_{REF}$ at the battery voltage $V_{BAT}$, the first switch SW1 and the fourth switch SW4 are closed. By closing the first switch SW1 and the fourth switch SW4, the fly capacitor $C_{FLY}$ is charged to thereby bring the reference voltage $V_{REF}$ to equal the battery voltage $V_{BAT}$ at the reference node N1. To further cause the voltage circuit 46 to generate the output voltage $V_{CC}$ at the battery voltage $V_{BAT}$, the fifth switch SW5 is also closed. In this regard, the multi-level charge pump 50 outputs the battery voltage $V_{BAT}$ as the low-frequency voltage $V_{DC}$ with a 100% duty cycle. Accordingly, the LC filter circuit 52 will output the battery voltage $V_{BAT}$ at the voltage output 48 as the output voltage $V_{CC}$. In the meantime, the second switch SW2, the third switch SW3, and the sixth switch SW6 remain open.

FIG. 4B illustrates an operating mode of the voltage circuit 46 that generates the reference voltage $V_{REF}$ higher than the battery voltage $V_{BAT}$ and the output voltage $V_{CC}$ at the battery voltage $V_{BAT}$. Common elements between FIGS. 3, 4A, and 4B are shown therein with common element numbers and will not be re-described herein.

To cause the voltage circuit 46 to output the reference voltage $V_{REF}$ higher than the battery voltage $V_{BAT}$, the third switch SW3 is closed. In this regard, the reference voltage $V_{REF}$ at the reference node N1 may be higher than the battery voltage $V_{BAT}$, depending on how much the fly capacitor $C_{FLY}$ has been charged. For example, if the fly capacitor $C_{FLY}$ has been fully charged to the battery voltage $V_{BAT}$ (e.g., by closing the first switch SW1 and the fourth switch SW4), then the voltage circuit 46 will output the reference voltage $V_{REF}$ at twice the battery voltage $V_{BAT}$ ($2 \times V_{BAT}$) when the third switch SW3 is closed.

To further cause the voltage circuit 46 to generate the output voltage $V_{CC}$ at the battery voltage $V_{BAT}$, the fifth switch SW5 is also closed. In this regard, the multi-level charge pump 50 outputs the battery voltage $V_{BAT}$ as the low-frequency voltage $V_{DC}$ with a 100% duty cycle. Accordingly, the LC filter circuit 52 will output the battery voltage $V_{BAT}$ at the voltage output 48 as the output voltage $V_{CC}$. In the meantime, the first switch SW1, the second switch SW2, the fourth switch SW4, and the sixth switch SW6 remain open.

With reference back to FIG. 3, the fast-switching power management circuit 40 includes a first hybrid circuit 62A (denoted as "Hybrid A") and a second hybrid circuit 62B (denoted as "Hybrid B"). The first hybrid circuit 62A and the second hybrid circuit 62B are coupled in parallel between the reference node N1 and the voltage output 48. Each of the first hybrid circuit 62A and the second hybrid circuit 62B can be controlled to adjust (increase or decrease) the output voltage $V_{CC}$ at the voltage output 48. In examples discussed herein, each of the first hybrid circuit 62A and the second hybrid circuit 62B can operate as a closed switch when being activated and operate as an open switch when being deactivated. In addition, each of the first hybrid circuit 62A and the second hybrid circuit 62B can also operate as a low dropout (LDO) regulator when being activated.

The fast-switching power management circuit 40 further includes a control circuit 64, which can be a field-programmable gate array (FPGA), as an example. The control circuit 64 is configured to receive a target voltage VTGT that indicates how the output voltage $V_{CC}$ will change (increase or decrease) in any of the time intervals $S_{N-1}$, $S_N$, and $S_{N+1}$. Accordingly, the control circuit 64 can activate a first one of the first hybrid circuit 62A and the second hybrid circuit 62B prior to a start of any of the time intervals $S_{N-1}$, $S_N$, and $S_{N+1}$ to thereby cause the output voltage $V_{CC}$ to change (increase or decrease) from one voltage level to another voltage level within the switching window (e.g., CP) in the respective one of the time intervals $S_{N-1}$, $S_N$, and $S_{N+1}$.

In a non-limiting example, the fast-switching power management circuit 40 includes a first coupling switch $S_{CPA}$, a second coupling switch $S_{CPB}$, a first offset capacitor $C_{OFFA}$, a second offset capacitor $C_{OFFB}$, a first pulldown switch $S_{PDA}$, and a second pulldown switch $S_{PDB}$. The first coupling switch $S_{CPA}$ is provided between the first hybrid circuit 62A and the voltage output 48. The second coupling switch $S_{CPB}$ is provided between the second hybrid circuit 62B and the voltage output 48. The first offset capacitor $C_{OFFA}$ is provided between a first coupling node 66A, which is located between the first hybrid circuit 62A and the first coupling switch $S_{CPA}$, and the GND. The second offset capacitor $C_{OFFB}$ is provided between a second coupling node 66B, which is located between the second hybrid circuit 62B and the second coupling switch $S_{CPB}$, and the GND. The first pulldown switch $S_{PDA}$ is coupled between the first coupling node 66A and the GND. The second pulldown switch $S_{PDB}$ is coupled between the second coupling node 66B and the GND.

Figure 5:
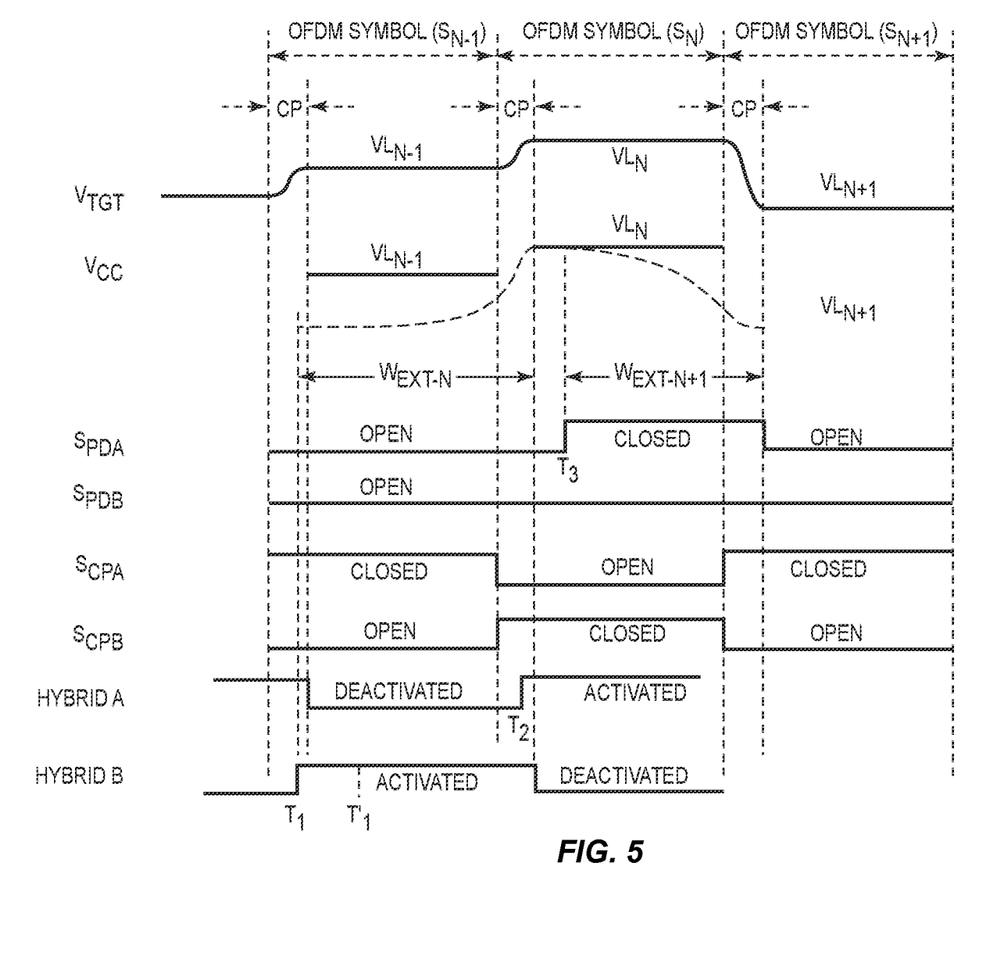
FIG. 5 is a time sequence diagram providing an exemplary illustration of specific operations of the fast-switching power management circuit of FIG. 3.

Specific operations of the fast-switching power management circuit 40 are further discussed now with reference to FIG. 5. FIG. 5 is a time sequence diagram providing an exemplary illustration of specific operations of the fast-switching power management circuit 40 of FIG. 3. Common elements between FIGS. 3 and 5 are shown therein with common element numbers and will not be re-described herein.

During the time interval $S_{N-1}$, the control circuit 64 receives the target voltage VTGT indicating that the output voltage $V_{CC}$ will increase from a present voltage level $VL_{N-1}$ (e.g., 1 V) in a present time interval $S_{N-1}$ to a future voltage level $VL_N$ (e.g., 5 V) in a future time interval $S_N$ that is immediately succeeding the present time interval $S_{N-1}$. In the meantime, the first coupling switch $S_{CPA}$ is closed to maintain the output voltage $V_{CC}$ at the present voltage level $VL_{N-1}$ and the second coupling switch $S_{CPB}$ is kept open. The first pulldown switch $S_{PDA}$ and the second pulldown switch $S_{PDB}$ are also kept open. The second hybrid circuit 62B is deactivated.

In response to receiving the target voltage VTGT, the control circuit 64 activates the second hybrid circuit 62B (also referred to as the "first one of the first hybrid circuit 62A and the second hybrid circuit 62B"). Accordingly, the second offset capacitor $C_{OFFB}$ can be charged toward the future voltage level $VL_N$ by drawing a rush current $I_{RUSH}$ from the voltage circuit 46. The control circuit 64 may activate the second hybrid circuit 62B at any time during the time interval $S_{N-1}$. For example, as shown in FIG. 5, the control circuit 64 activates the second hybrid circuit 64B at time $T_1$ located within the switching window (a.k.a. CP) of the time interval $S_{N-1}$ or at time $T'_1$ located outside the switching window.

In case the control circuit 64 activates the second hybrid circuit 62B at time $T_1$, the first hybrid circuit 64A (also referred to as the "second one of the first hybrid circuit 62A and the second hybrid circuit 62B") may remain activated to continue driving the output voltage $V_{CC}$ toward the present voltage level $VL_{N-1}$. However, if the control circuit 64 activates the second hybrid circuit 62B at time $T'_1$, the first hybrid circuit 62A would have been deactivated. In this regard, it can be said that the second hybrid circuit 62B can be activated independent of whether the first hybrid circuit 62A is activated, and vice versa.

Regardless, the fast-switching power management circuit 40 will have an extended switching window $W_{EXT-N}$, which lasts from time $T_1/T'_1$ till end of the switching window (a.k.a. CP) in the time interval $S_N$, to charge the second offset capacitor $C_{OFFB}$ to the future voltage level $VL_N$. As a result, it is possible to reduce the rush current $I_{RUSH}$ according to the equation (Eq. 1) to prolong battery life. In addition, the extended switching window $W_{EXT-N}$ can also ensure that the output voltage $V_{CC}$ can reach the future voltage level $VL_N$ within the switching window of the time interval $S_N$.

At a start of the time interval $S_N$, the control circuit 64 concurrently closes the second coupling switch $S_{CPB}$ and opens the first coupling switch $S_{CPA}$. As such, the output voltage $V_{CC}$ will be provided from the second offset capacitor $C_{OFFB}$. In the meantime, the second hybrid circuit 62B may remain activated until an end of the switching window in the time interval $S_N$.

During time interval $S_N$, the control circuit 64 receives the target voltage VTGT indicating that the output voltage $V_{CC}$ will decrease from a present voltage level $VL_N$ (e.g., 5 V) in a present time interval $S_N$ to a future voltage level $VL_{N+1}$ (e.g., 3 V) in a future time interval $S_{N+1}$ that is immediately succeeding the present time interval $S_N$. In response to receiving the target voltage VTGT, the control circuit 64 opens the first coupling switch $S_{CPA}$. Concurrent or subsequent to opening the first coupling switch $S_{CPA}$, the control circuit 64 can activate/deactivate the first hybrid circuit 62A and/or open/close the first pulldown switch $S_{PDA}$ to start discharging the first offset capacitor $C_{OFFA}$ toward the future voltage level $VL_{N+1}$. The control circuit 64 may opportunistically harvest some of the electrical potential energy discharged by the first offset capacitor $C_{OFFA}$ to further prolong the battery life. Specifically, the control circuit 64 can determine whether and when to activate/deactivate the first hybrid circuit 62A and/or open/close the first pulldown switch $S_{PDA}$ based on a relationship between the present voltage level $VL_N$, the future voltage level $VL_{N+1}$, and the battery voltage V BAT.

In case the future voltage level $VL_{N+1}$ is higher than the battery voltage $V_{BAT}$, it is possible to use the voltage circuit 46 to harvest at least a portion of the electrical potential energy discharged from the first offset capacitor $C_{OFFA}$. Specifically, the control circuit 64 activates the first hybrid circuit 62A (e.g., at time $T_2$), while keeping the first pulldown switch $S_{PDA}$ open, to allow a discharge current $I_{DCHG}$ (shown in FIG. 3) to flow to the reference node N1 in the voltage circuit 46. For more specific embodiments related to harvesting the electrical potential energy, please refer to U.S. patent application Ser. No. 17/325,482, entitled "POWER MANAGEMENT CIRCUIT OPERABLE TO REDUCE ENERGY LOSS." The control circuit 64 can deactivate the first hybrid circuit 62A when a voltage held by the first offset capacitor $C_{OFFA}$ reduces to the future voltage level $VL_{N+1}$.

In case the present voltage level $VL_N$ is higher than the battery voltage $V_{BAT}$ and the future voltage level $VL_{N+1}$ is lower than the battery voltage $V_{BAT}$, it is also possible to use the voltage circuit 46 to harvest some of the electrical potential energy discharged from the first offset capacitor $C_{OFFA}$. Specifically, the control circuit 64 activates the first hybrid circuit 62A (e.g., at time $T_2$), while keeping the first pulldown switch $S_{PDA}$ open, to allow a discharge current $I_{DCHG}$ to flow to the reference node N1 in the voltage circuit 46.

Notably, the discharge current $I_{DCHG}$ can only flow into the voltage circuit 46 when the voltage held by the first offset capacitor $C_{OFFA}$ is higher than the battery voltage $V_{BAT}$. In this regard, as long as the voltage held by the first offset capacitor $C_{OFFA}$ becomes lower than or equal to the battery voltage $V_{BAT}$, the control circuit 64 will deactivate the first hybrid circuit 62A to stop harvesting energy from the first offset capacitor $C_{OFFA}$. Concurrent or subsequent to deactivating the first hybrid circuit 62A (e.g., at time $T_3$), the control circuit 64 closes the first pulldown switch $S_{PDA}$ to continue discharging the first offset capacitor toward the future voltage level $VL_{N+1}$. The control circuit 64 opens the first pulldown switch $S_{PDA}$ when the voltage held by the first offset capacitor $C_{OFFA}$ reduces to the future voltage level $VL_{N+1}$.

In case the present voltage level $VL_N$ is lower than or equal to the battery voltage $V_{BAT}$, it will not be possible to harvest any of the electrical potential energy discharged from the first offset capacitor $C_{OFFA}$. As such, the control circuit 64 can simply close the first pulldown switch $S_{PDA}$ to shunt the discharge current $I_{DCHG}$ to the GND. The control circuit 64 opens the first pulldown switch $S_{PDA}$ when the voltage held by the first offset capacitor $C_{OFFA}$ reduces to the future voltage level $VL_{N+1}$.

Notably, the specific operations discussed in FIG. 5 are merely non-limiting examples. It should be appreciated that the same operation may be repeated, in same or different sequence, in any number of time intervals (e.g., OFDM symbols or Wi-Fi frames).

Those skilled in the art will recognize improvements and modifications to the preferred embodiments of the present disclosure. All such improvements and modifications are considered within the scope of the concepts disclosed herein and the claims that follow.

What is claimed is:

1. A fast-switching power management circuit comprising:
    a voltage circuit configured to generate a reference voltage at a reference node and an output voltage at a voltage output based on a battery voltage;
    a first hybrid circuit and a second hybrid circuit each coupled between the reference node and the voltage output and configured to adjust the output voltage in each of a plurality of time intervals based on the reference voltage, the plurality of time intervals each corresponding to an orthogonal frequency division multiplexing (OFDM) symbol and comprising a switching window from a start of a respective one of the plurality of time intervals; and
    a control circuit configured to:
        receive a target voltage during a present time interval among the plurality of time intervals indicating that the output voltage will change from a present voltage level in the present time interval to a future voltage level in a future time interval immediately succeeding the present time interval among the plurality of time intervals; and
        activate a first one of the first hybrid circuit and the second hybrid circuit during the present time interval to thereby cause the output voltage to change from the present voltage level to the future voltage level within the switching window of the future time interval.

2. The fast-switching power management circuit of claim 1, wherein the control circuit is further configured to activate the first one of the first hybrid circuit and the second hybrid circuit independent of whether a second one of the first hybrid circuit and the second hybrid circuit is activated.

3. The fast-switching power management circuit of claim 1, further comprising:
    a first coupling switch provided between the first hybrid circuit and the voltage output;
    a second coupling switch provided between the second hybrid circuit and the voltage output;
    a first offset capacitor provided between a first coupling node located between the first hybrid circuit and the first coupling switch and a ground; and
    a second offset capacitor provided between a second coupling node located between the second hybrid circuit and the second coupling switch and the ground.

4. The fast-switching power management circuit of claim 3, wherein the control circuit is further configured to:
    receive the target voltage indicating that the output voltage will increase from the present voltage level in the present time interval to the future voltage level in the future time interval;
    open a respective one of the first coupling switch and the second coupling switch that is coupled to the first one of the first hybrid circuit and the second hybrid circuit; and
    activate the first one of the first hybrid circuit and the second hybrid circuit to charge a respective one of the first offset capacitor and the second offset capacitor to the future voltage level within the switching window from the start of the future time interval.

5. The fast-switching power management circuit of claim 4, wherein the control circuit is further configured to close the respective one of the first coupling switch and the second coupling switch at the start of the future time interval to thereby cause the output voltage to be maintained at the future voltage level during the future time interval.

6. The fast-switching power management circuit of claim 5, wherein the control circuit is further configured to deactivate the first one of the first hybrid circuit and the second hybrid circuit no later than an end of the switching window in the future time interval.

7. The fast-switching power management circuit of claim 4, wherein the control circuit is further configured to:
    deactivate a second one of the first hybrid circuit and the second hybrid circuit prior to the start of the future time interval; and
    open a respective one of the first coupling switch and the second coupling switch that is coupled to the second one of the first hybrid circuit and the second hybrid circuit at the start of the future time interval.

8. The fast-switching power management circuit of claim 3, further comprising:
    a first pulldown switch coupled between the first coupling node and the ground; and
    a second pulldown switch coupled between the second coupling node and the ground.

9. The fast-switching power management circuit of claim 8, wherein the control circuit is further configured to:
    receive the target voltage indicating that the output voltage will decrease from the present voltage level in the present time interval to the future voltage level in the future time interval;
    open the respective one of the first coupling switch and the second coupling switch that is coupled to the first one of the first hybrid circuit and the second hybrid circuit; and
    cause a respective one of the first offset capacitor and the second offset capacitor to discharge to the future voltage level within the switching window from the start of the future time interval.

10. The fast-switching power management circuit of claim 9, wherein the control circuit is further configured to:
    deactivate a second one of the first hybrid circuit and the second hybrid circuit prior to the start of the future time interval; and
    open a respective one of the first coupling switch and the second coupling switch that is coupled to the second one of the first hybrid circuit and the second hybrid circuit at the start of the future time interval.

11. The fast-switching power management circuit of claim 9, wherein the control circuit is further configured to:
   determine that the future voltage level is higher than the battery voltage; and
   activate the first one of the first hybrid circuit and the second hybrid circuit to harvest electrical potential energy from the respective one of the first offset capacitor and the second offset capacitor.

12. The fast-switching power management circuit of claim 9, wherein the control circuit is further configured to:
   determine that the present voltage level is higher than the battery voltage and the future voltage level is lower than the battery voltage; and
   activate the first one of the first hybrid circuit and the second hybrid circuit to harvest electrical potential energy from the respective one of the first offset capacitor and the second offset capacitor.

13. The fast-switching power management circuit of claim 12, wherein the control circuit is further configured to:
   determine that the present voltage level is reduced to the battery voltage;
   deactivate the first one of the first hybrid circuit and the second hybrid circuit; and
   close the respective one of the first pulldown switch and the second pulldown switch to continue discharging the respective one of the first offset capacitor and the second offset capacitor to the future voltage level.

14. The fast-switching power management circuit of claim 9, wherein the control circuit is further configured to:
   determine that the present voltage level is lower than or equal to the battery voltage;
   deactivate the first one of the first hybrid circuit and the second hybrid circuit; and
   close a respective one of the first pulldown switch and the second pulldown switch that is coupled to the first coupling node to thereby discharge the respective one of the first offset capacitor and the second offset capacitor to the future voltage level.

15. The fast-switching power management circuit of claim 1 wherein the voltage circuit comprises:
   a multi-level charge pump configured to generate a low-frequency voltage at multiple levels based on the battery voltage and in accordance with a selected duty cycle; and
   an inductor-capacitor (LC) filter circuit coupled between the multi-level charge pump and the voltage output and configured to average the multiple levels of the low-frequency voltage to generate the output voltage at the voltage output.

16. The fast-switching power management circuit of claim 15 wherein the multi-level charge pump comprises:
   an input node coupled to a voltage source to receive the battery voltage;
   an output node coupled to the LC filter circuit to output the low-frequency voltage;
   a first switch coupled between the input node and the reference node;
   a second switch coupled between the reference node and the output node;
   a third switch coupled between the input node and an intermediate node;
   a fourth switch coupled between the intermediate node and a ground;
   a fifth switch coupled between the input node and the output node;
   a sixth switch coupled between the output node and the ground; and
   a fly capacitor coupled between the reference node and the intermediate node.

17. The fast-switching power management circuit of claim 16 wherein the control circuit is further configured to:
   close the first switch, close the fourth switch, and open the third switch concurrently to charge the fly capacitor to the battery voltage; and
   open the first switch, open the fourth switch, and close the third switch concurrently to generate the reference voltage higher than the battery voltage at the reference node.

18. The fast-switching power management circuit of claim 17 wherein the control circuit is further configured to close the fifth switch to cause the multi-level charge pump to output the low-frequency voltage at the battery voltage to thereby cause the LC filter circuit to generate the output voltage at the battery voltage.

19. The fast-switching power management circuit of claim 1, wherein the first hybrid circuit and the second hybrid circuit are each configured to:
   operate as a closed switch when being activated; and
   operate as an open switch when being deactivated.

* * * * *